United States Patent
Dogiamis et al.

(10) Patent No.: US 11,437,706 B2
(45) Date of Patent: Sep. 6, 2022

(54) PACKAGE WITH SIDE-RADIATING WAVE LAUNCHER AND WAVEGUIDE

(71) Applicant: Intel Corporation, Santa Clara, CA (US)

(72) Inventors: Georgios Dogiamis, Chandler, AZ (US); Aleksandar Aleksov, Chandler, AZ (US); Telesphor Kamgaing, Chandler, AZ (US); Gilbert W. Dewey, Beaverton, OR (US); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 646 days.

(21) Appl. No.: 16/369,452

(22) Filed: Mar. 29, 2019

(65) Prior Publication Data

US 2020/0280121 A1    Sep. 3, 2020

(30) Foreign Application Priority Data

Feb. 28, 2019    (GR) .............................. 20190100106

(51) Int. Cl.
| | | |
|---|---|---|
| *H01L 25/065* | (2006.01) | |
| *H01Q 1/22* | (2006.01) | |
| *H01L 23/00* | (2006.01) | |
| *H01L 23/66* | (2006.01) | |
| *H01L 23/552* | (2006.01) | |
| *H01L 25/00* | (2006.01) | |

(52) U.S. Cl.
CPC ......... *H01Q 1/2283* (2013.01); *H01L 23/552* (2013.01); *H01L 23/66* (2013.01); *H01L 24/16* (2013.01); *H01L 24/81* (2013.01); *H01L 25/0655* (2013.01); *H01L 25/50* (2013.01); *H01L 2223/6633* (2013.01); *H01L 2223/6677* (2013.01); *H01L 2224/16225* (2013.01); *H01L 2924/1421* (2013.01); *H01L 2924/19032* (2013.01); *H01L 2924/3025* (2013.01)

(58) Field of Classification Search
CPC .................................................. H01L 25/0655
See application file for complete search history.

(56) References Cited

U.S. PATENT DOCUMENTS

| | | | | |
|---|---|---|---|---|
| 10,756,445 | B2* | 8/2020 | Chen ..................... | H01Q 21/245 |
| 2011/0095385 | A1* | 4/2011 | Kawamura ............ | H01Q 23/00 |
| | | | | 257/E25.001 |
| 2014/0154999 | A1* | 6/2014 | Rofougaran ............. | H04B 1/40 |
| | | | | 455/73 |
| 2014/0285389 | A1* | 9/2014 | Fakharzadeh .......... | H01Q 13/02 |
| | | | | 343/786 |
| 2016/0164189 | A1* | 6/2016 | Jafarlou ................. | H01Q 13/02 |
| | | | | 29/601 |
| 2018/0090848 | A1* | 3/2018 | Elsherbini ............. | H01P 5/1007 |
| 2018/0191049 | A1* | 7/2018 | Kamgaing .............. | H01P 3/122 |

\* cited by examiner

*Primary Examiner* — Errol V Fernandes
(74) *Attorney, Agent, or Firm* — Akona IP

(57) ABSTRACT

Embodiments may relate to an semiconductor package. The semiconductor package may include a die coupled with the face of the package substrate. The semiconductor package may further include a waveguide coupled with the face of the package substrate adjacent to the die, wherein the waveguide is to receive an electromagnetic signal from the die and facilitate conveyance of the electromagnetic signal in a direction parallel to the face of the package substrate. Other embodiments may be described or claimed.

20 Claims, 9 Drawing Sheets

Coupling a die with a face of a package substrate
805

Positioning a waveguide on the face of the package substrate
810

PACKAGE WITH SIDE-RADIATING WAVE LAUNCHER AND WAVEGUIDE

CROSS-REFERENCE TO RELATED APPLICATIONS

This application claims priority to Greek Patent Application No. 20190100106 filed Feb. 28, 2019 and entitled "Package with Side-Radiating Wave Launder and Waveguide", which is hereby incorporated by reference in its entirety herein

BACKGROUND

Generally, for high-speed die connectivity in multichip packages, signals may be launched vertically out of a die. Additionally, relatively high-frequency (e.g., millimeter wave (mmWave)) waveguides used for such high-speed links may typically utilize connectors placed on top of the die surface. Alternatively, a high-speed signal may be launched directly in the package using microstrip/embedded waveguides/striplines, and then subsequently be launched into a vertical waveguide which may be embedded in the package or attached on the package using connectors. These embodiments may require access to the die or package surface, which may be difficult and may require disruption of both package technology and architecture. Additionally, these embodiments may require several parts in the signal line, each of which may degrade the signal quality.

DETAILED DESCRIPTION

Figure 1:
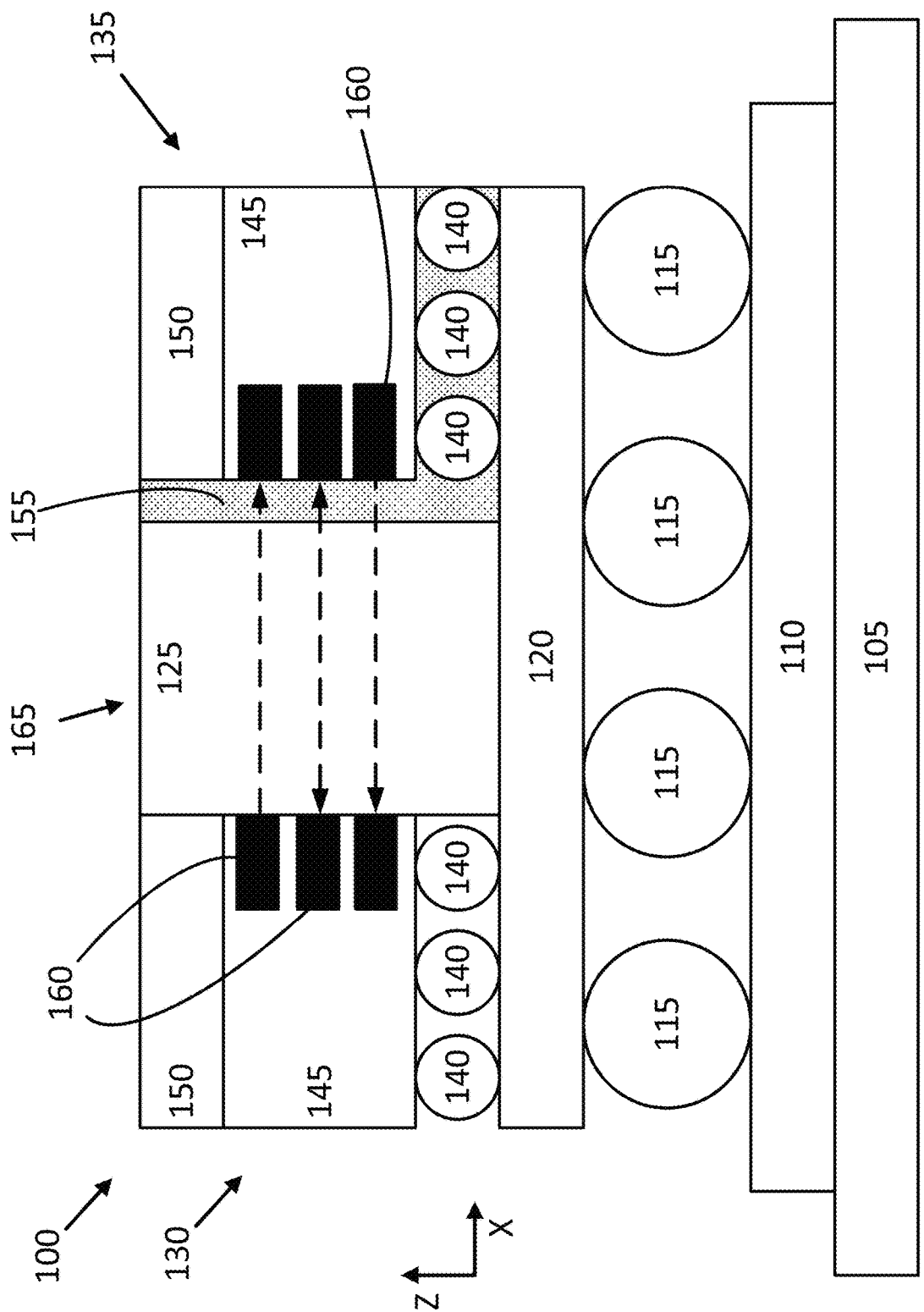
FIG. 1 depicts a simplified example diagram of a multichip package with side-radiating wave launchers and a waveguide, in accordance with embodiments of the present disclosure.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Embodiments of the present disclosure may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Generally, embodiments of the present disclosure relate to direct high-speed connectivity of dies on multichip packages in a computational system through individual waveguides, or waveguide bundles. The waveguide components used in embodiments of the present disclosure may be individually assembled as surface-mount technology (SMT) components, or they may be picked-placed and glued in place. This direct connectivity of dies using dielectric-shielded (or metallic-shielded) waveguides may minimize assembly operations and result in lower-cost systems that are simpler than legacy systems. Additionally, embodiments of the present disclosure may result in minimum disruption to die and package substrate architecture and technology. Alignment between waveguide and a die may be achieved inherently by the employment of such pick-and-place or SMT technologies. Specifically, such techniques may allow for precision with variation on the order of less than 10 micrometers (microns or μm). As a result, embodiments of the present disclosure may allow for a simple, precise, and low-cost way to directly align and connect various waveguides to radiating elements on a die, which may allow for minimal disruptions in the signal path between one die and another.

Generally, as noted above, legacy solutions for use of a waveguide on a package has involved launching the signally vertically from the die itself, or laterally from the die into the package and then vertically from the package. For high-frequency signals on the order of a mmWave signal (e.g., greater than approximately 20 gigahertz (GHz)), the waveguide used for such high-speed links may use connectors placed on top of the die surface. Alternatively, the signal may be launched directly into the package as described above, and then subsequently be launched vertically into a waveguide that is attached on the package.

However, as noted above, the legacy techniques may present one or more difficulties. For example, access to the top of the die may be difficult to achieve if the die is mounted to the package by using flip-chip (FC) assembly techniques. Furthermore, integrated hear spreaders may further constrain access to the die. Additionally, the waveguide may be coupled with the die or the package using one or more connectors, which may add to the total cost of the system both in terms of financial and time constraints, and may have to comply with specific tolerance requirements. Additionally, extra package layers may be needed to embed high-speed waveguides (such as striplines, grounded coplanar waveguides, dielectric waveguides etc.), which may further increase package complexity and cost. Finally, as noted above, as the package includes increased numbers of components, each of the components may contribute to eventual signal degradation of the signal propagating throughout the die, package, or waveguide.

By contrast, embodiments of the present disclosure may provide a plurality of advantages. Specifically, embodiments may eliminate or reduce any requirements for a special connector structure, which may result in cost savings and increased manufacturing simplicity. Additionally, embodiments of the present disclosure may reduce the need for an alignment effort to align the waveguide with the die or package, which may reduce cost. Additionally, if chosen correctly, then the material holding the waveguides in place on the package substrate may be removed selectively without damaging the waveguide, package substrate, or die, which may allow for relatively easy die or waveguide replacement. Additionally, by assembling the waveguides on the package, the choice of waveguide material may be decoupled from the package manufacturing technology, so additional materials may be considered for the waveguide. For example, the waveguide may be made of, or may include, relatively low-loss materials such as quartz, glass, polytetrafluoroethylene (PTFE), polyethelene (PE), foamed low-loss polymers, etc.

Additionally, embodiments of the present disclosure may provide an electrical performance advantage because there may be fewer transitions/connections. More specifically, embodiments of the present disclosure may only have a signal transition between the die and the waveguide, which may reduce or eliminate detrimental electrical effects to the signal such as increased losses. In this way, low-loss and low latency waveguide links may be achieved.

FIG. 1 depicts a simplified example diagram of a multichip package with side-radiating wave launchers and a waveguide, in accordance with embodiments of the present disclosure. It will be understood that FIG. 1 (and other Figures herein) is depicted as a highly simplified example where certain dimensions or elements may be made larger or smaller than they would otherwise be in real-world embodiments. These dimensional changes are made for the sake of clarity of the Figures, and relative dimensions or scale should not be inferred based on the Figures unless explicitly discussed herein.

More generally, FIG. 1 depicts a semiconductor package 100 coupled with a printed circuit board (PCB) 105. The PCB 105 may be, for example, a PCB of a electronic device and may include a substrate with one or more organic or inorganic layers. The PCB 105 may further include one or more conductive elements such as traces, vias, etc. and one or more logic additional elements such as a semiconductor package, a processor, a memory etc. coupled thereto. In other embodiments, the PCB 105 may be, for example, a substrate of an interposer or some other type of substrate of a electronic device.

In some embodiments the PCB 105 may include a socket 110 positioned between the package 100 and the PCB 105. The socket 110 may be, for example, a socket of a ball grid array (BGA), land grid array (LGA), pin grid array (PGA), a mechanical socket, or some other type of socket. Although the socket 110 is depicted as a simplified rectangle in FIG. 1 that is only positioned between the package 100 and the PCB 105, it will be understood that in some embodiments the socket 110 may extend at least partially up one or more sides of the package 100, and in some embodiments the socket 110 may at least partially overlap the package 100 such that the socket forms a mechanical clamp mechanism against the package 100. Other types of sockets may be used in other embodiments. In some embodiments, the socket 110 may be considered optional and may not be present at all. These variations in the socket 110 may not be shown in FIG. 1 for the sake of reduction of clutter of the Figure.

The package 100 may include one or more interconnects 115 that couple the package 100 with the socket 110. Specifically, the interconnects 115 may couple a package substrate 120 of the package 100 with the socket 110 (or, if the socket 110 is missing, directly to the PCB 105). The interconnects 115 are depicted in FIG. 1 as generally circular and may be considered to represents solder balls of a BGA. In other embodiments, the interconnects 115 may be considered to be pins of a PGA, interconnects of a LGA, solder bumps, adhesive elements, or some other type of interconnect.

The substrate 120 may be a package substrate which may be similar to the PCB 105. The substrate 120 may be cored or coreless, and may include one or more layers of an organic or inorganic dielectric material. Additionally, the substrate 120 may include one or more conductive elements such as vias, traces, etc. In some embodiments the substrate 120 may include one or more computing elements such as a processor, memory, etc. either within the substrate 120 or coupled with the substrate 120 in addition to the elements shown in FIG. 1. These extra elements may not be shown in FIG. 1 for the sake of reduction of clutter of the Figure.

The package 100 may further include one or more dies coupled with the package substrate 120. Specifically, FIG. 1 depicts two dies 130 and 135. Generally, one or both of the dies 130/135 may be, e.g., a processor or processing element such as a central processing unit (CPU), a general processing unit (GPU), an element or core of a distributed processor, or some other type of element or processor. Additionally or alternatively, one or both of the dies 130/135 may be, e.g., a memory such as a non-volatile memory (NVM), a flash memory, a dynamic random access memory (DRAM), a double data rate (DDR) memory, or some other type of memory. Additionally or alternatively, one or both of the dies 130/135 may be an element of, or related to, radio frequency (RF) circuitry that is designed to transmit, receive, facilitate transmission of, facilitate reception of, or otherwise process, generate, or alter one or more RF signals from a radiative antenna. Such signals may be, for example, signals in accordance with second generation (2G) transmission protocols, third generation (3G) transmission protocols, fourth generation (4G) transmission protocols, fifth generation (5G) transmission protocols, Bluetooth® transmission protocols, Wi-Fi transmission protocols, or some other wireless transmission protocol either known or subsequently developed.

The dies 130/135 may have an active portion 150, and a backend or inactive portion 145. The active portion 150 may include one or more logic elements such as a processor, a transistor, etc. The inactive portion may include routing elements such as vias, traces, etc. Generally, the active and inactive portions 145/150 may be formed of a material such as silicon or some other substrate material. The dies 130/135 may be coupled with the package substrate 120 by one or more interconnects 140, which may be similar to interconnects 115. Specifically, the interconnects 140 may be a solder ball or a solder bump, while in other embodiments the interconnects 140 may be elements of a PGA, elements of an LGA, an adhesive element, or some other type of element that may physically or communicatively couple the dies 130/135 to the package substrate 120. Generally, the dies 130 and 135 may be roughly 1 centimeter (cm) apart. More generally, the dies 130 and 135 may be between approximately 0.5 cm and 2 cm apart from each other as measured in a direction parallel to the face of the substrate 120 to which they are coupled.

As can be seen in FIG. 1, the inactive portion 145 of the dies 130/135 may include one or more signal launchers 160. For example, die 130 is depicted as having two signal launchers 160, while die 135 is depicted as having only one signal launcher 160. In other embodiments, each of the dies may have more or fewer signal launchers 160. For example, in some embodiments a die may have up to 10 signal launchers per linear edge. However, other embodiments may have more or fewer signal launchers based on factors such as die size requirements, signal requirements, power requirements, etc.

The signal launchers 160 may be considered to be RF radiative elements that are configured to emit (i.e., transmit) an electromagnetic signal from the dies 130/135. The electromagnetic signals are depicted in FIG. 1 as the lateral dashed and arrowed lines passing through the waveguide 125, as will be discussed in greater detail below. In some embodiments, the signal launchers 160 may be referred to as "wave launchers." The electromagnetic signal may be, for example, a mmWave signal with a frequency between approximately 20 GHz and 300 GHz. In other embodiments, the electromagnetic signal may have a frequency greater or less than the mmWave range. For example, in some embodiments the frequency of the electromagnetic signal may be greater than approximately 300 GHz and may be on the order of a terahertz (THz) or greater.

As shown, two signal launchers 160 may generally face one another, and transmit to one another/receive from one another. In other words, each of the signal launchers may include both transmission and receive circuitry, and be co-linear as shown by the dashed line with arrows on both ends. Alternatively, in some embodiments a signal launcher may only include transmit circuitry or receive circuitry, as further shown in FIG. 1 by the dashed lines with only a single arrow. In other embodiments, one signal launcher 160 may not transmit to another signal launcher 160, but rather it may transmit to some other type of receive circuitry.

Generally, RF circuitry on the dies 130/135 may generate the signal and transmit the signal to the signal launchers 160, where the signal launchers 160 may convert the electronic signal into an electromagnetic wave which may then be emitted from the signal launchers. The RF circuitry is not shown in FIG. 1 to avoid clutter of the Figure, but it may be located in the active portion 150 or the inactive portion 145 of the dies 130/135. In some embodiments, the RF circuitry may be referred to as an RF "front-end." The RF circuitry may be an element of logic within the dies 130/135, for example a processor. In other embodiments the RF circuitry may be separate from, but communicatively coupled to the logic within the dies.

Figure 2:
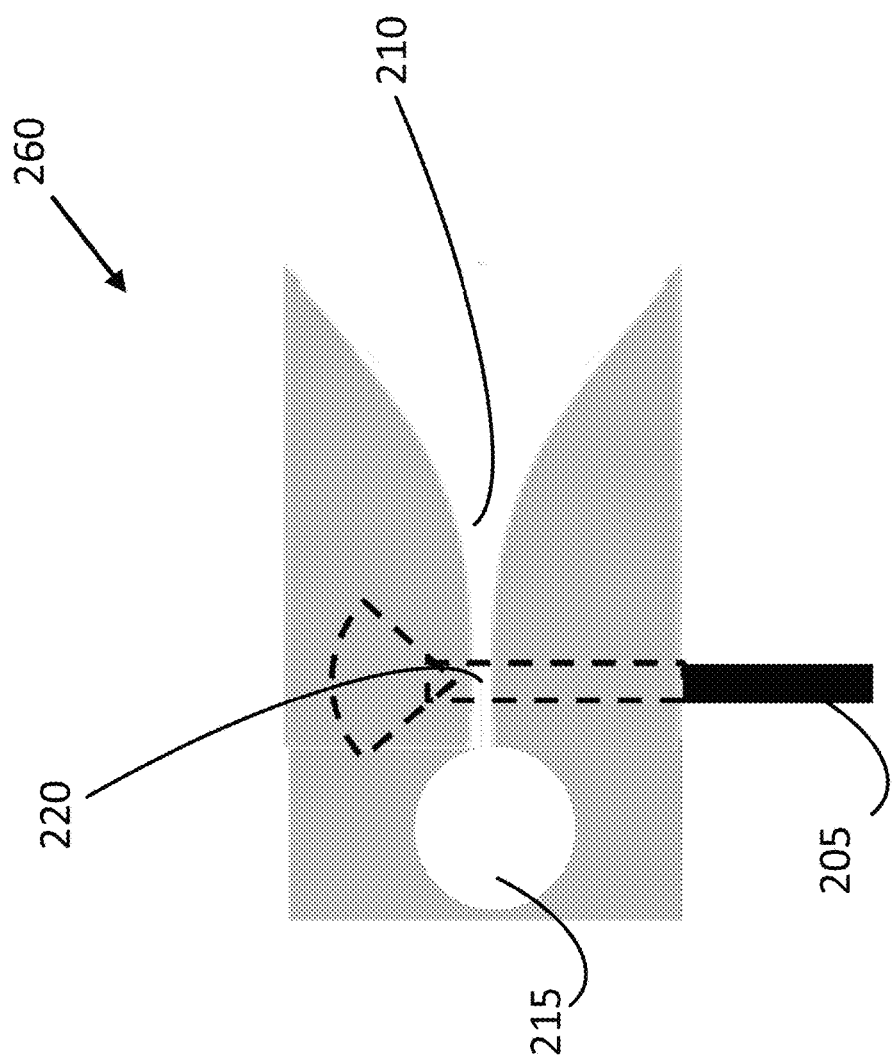
FIG. 2 depicts a simplified example top-down view of a side-radiating wave launcher, in accordance with embodiments of the present disclosure.

Generally, the signal launchers 160 may be radiative element that is constructed from the metal layers of the die interconnect stack within the dies 130/135, or from redistribution layers (RDLs) of the dies 130/135. Examples of such signal launchers may include a Vivaldi antenna, a broadband microstrip-to-tapered slot transition, a horn-like launcher structure, a leaky-wave antenna or some other type of electromagnetic radiative structure. FIG. 2 depicts an example of such a signal launcher 260. Specifically, FIG. 2 is a top-down view of a signal launcher 260, which may be used as signal launcher 160. Generally, the signal launcher 260 may be considered to be a microstrip-to-slotline transition. Specifically, the signal may arrive by way of a microstrip feedline 205 that has a broadband termination. The signal may couple into the slotline 210 consequently propagate through a transition point 220 away from the open broadband termination 215, and towards the tapered horn along the slotline 210. The taper of the slotline 210 may be linear, quadratic, stepped or some other type of taper. The signal leaves (in the case of the Tx side) or enters the taper (in the case of the Rx side) to or from the waveguide channel to which it is attached.

The dies 130/135 may form a cavity 165 between them. The package 100 may include a waveguide 125 placed within the cavity 165. As can be seen in FIG. 1, the waveguide 125 may be directly touching a die such as die 135, or the waveguide 125 may be adjacent to but not directly touching a die such as die 135. It will be understood that FIG. 1 is only one example, and in other embodiments the waveguide 125 may be touching both dies 130/135, neither of the dies 130/135, or it may be touching die 135 and not touching die 130. In embodiments where the waveguide 125 is not touching a die such as die 135, the waveguide 125 may be separated from the die 135 in a direction parallel to the face of the package substrate 120 by a distance of a few microns. For example, the waveguide 125 may be separated from the die 135 by up to 5 microns in some embodiments, whereas in other embodiments the amount of separation may be greater or smaller.

Generally, the waveguide 125 may include one or more channels of a material with a relatively high dielectric constant (which may also be referred to as a "high-permittivity" channel). For example, the dielectric constant of the material may be on the order of between approximately 2 and approximately 10. Example materials may include quartz, silicon, glass, low-temperature co-fired ceramic (LTCC), polyetheretherketone (PEEK), or polyethylene terephthalate (PET), PTFE, PE, fluorinated ethylene propylene (FEP), PTFE filled with ceramic materials, or some other similar material. One or more electromagnetic signals may propagate through the one or more high-permittivity channels. As an example, the waveguide 125 may be viewed to have at least three channels, through which the three electromagnetic signals launched from signal launchers 160 may propagate. Generally, materials with a relatively high dielectric constant may be preferred because they may offer greater signal confinement, which may reduce the amount of crosstalk between channels. Materials with a relatively high dielectric constant may also reduce the physical dimensions of the waveguide 125, which may allow for lower-size components.

Generally, the waveguide 125 may be placed in the cavity 165 through a variety of techniques. For example, the waveguide 125 may be pre-manufactured and positioned in the cavity 165 through an SMT technique such as gluing the waveguide 125 in place within the cavity 165. In other embodiments, the waveguide 125 each channel of a multi-channel waveguide 125 may be individually coupled with the package substrate 120 through a SMT technique such as an adhesive. In other embodiments, the waveguide 125 may be formed directly on the package substrate 120 through a variety of techniques such as lamination, deposition, etc.

In some embodiments, the waveguide 125 may be positioned within the cavity 165, and then an additional cladding material may be positioned at least partially around the waveguide 125 or one or more of the dies 130/135. Generally, the waveguide may be clad directly (e.g., by application of a cladding material over the waveguide faces) by a metallic material such as aluminum, steel, copper, iron, a conductive plastic material, etc. This may result in a "metallic-clad waveguide" which may have one set of propagation modes. Alternatively, the waveguide 125 may be a "dielectric-only" type of waveguide, i.e., without a metallic cladding element.

In some embodiments, the waveguide 125 (regardless of whether it is a metallic-clad waveguide or a dielectric-only waveguide) may include an electromagnetic interference (EMI) shield. The EMI shield may be located at a top portion of the waveguide (e.g., near the top of the waveguide as oriented in FIG. 1). In general, the EMI shield may include any structure of an electrically conductive material, e.g., metal or an alloy of metals, suitable to reduce or eliminate EMI. In some embodiments, the EMI shield may look similar to, or include, a metallic sheet. In some embodiments, the EMI shield may not touch the waveguide 125 itself, but rather may be physically separated from, but at least partially enclose, the waveguide 125 or a portion thereof.

In embodiments where the waveguide 125 is not touching a die 130 or 135, an underfill material 155 may be present between the waveguide 125 and one or more of the dies 130 or 135. As described above, in some embodiments the waveguide 125 may be a "cladded" waveguide while in other embodiments the waveguide 125 may not have the additional cladding material. In embodiments where the waveguide 125 is cladded, the underfill material 155 may be a known underfill material such as an epoxide matrix with ceramic filler material. The filler material may be, e.g., such as silicon oxide (SiO2) particles, alumina, etc. However, in embodiments where the waveguide 125 is not cladded, it may be desirable to pick the material of the underfill material 155 to have a lower dielectric constant than the dielectric constant of the waveguide 125. This selection may help to reduce or eliminate signal leakage from the waveguide 125 into the underfill material 155.

As noted above, in some embodiments the waveguide 125 may be coupled with the package substrate 120 by an adhesive material. However, in other embodiments the waveguide 125 may be additionally or alternatively coupled with the package substrate 120 through a different means such as through use of an epoxy, a molding material, an assembled "retention mechanism" such as a clamp, etc.

Figure 3:
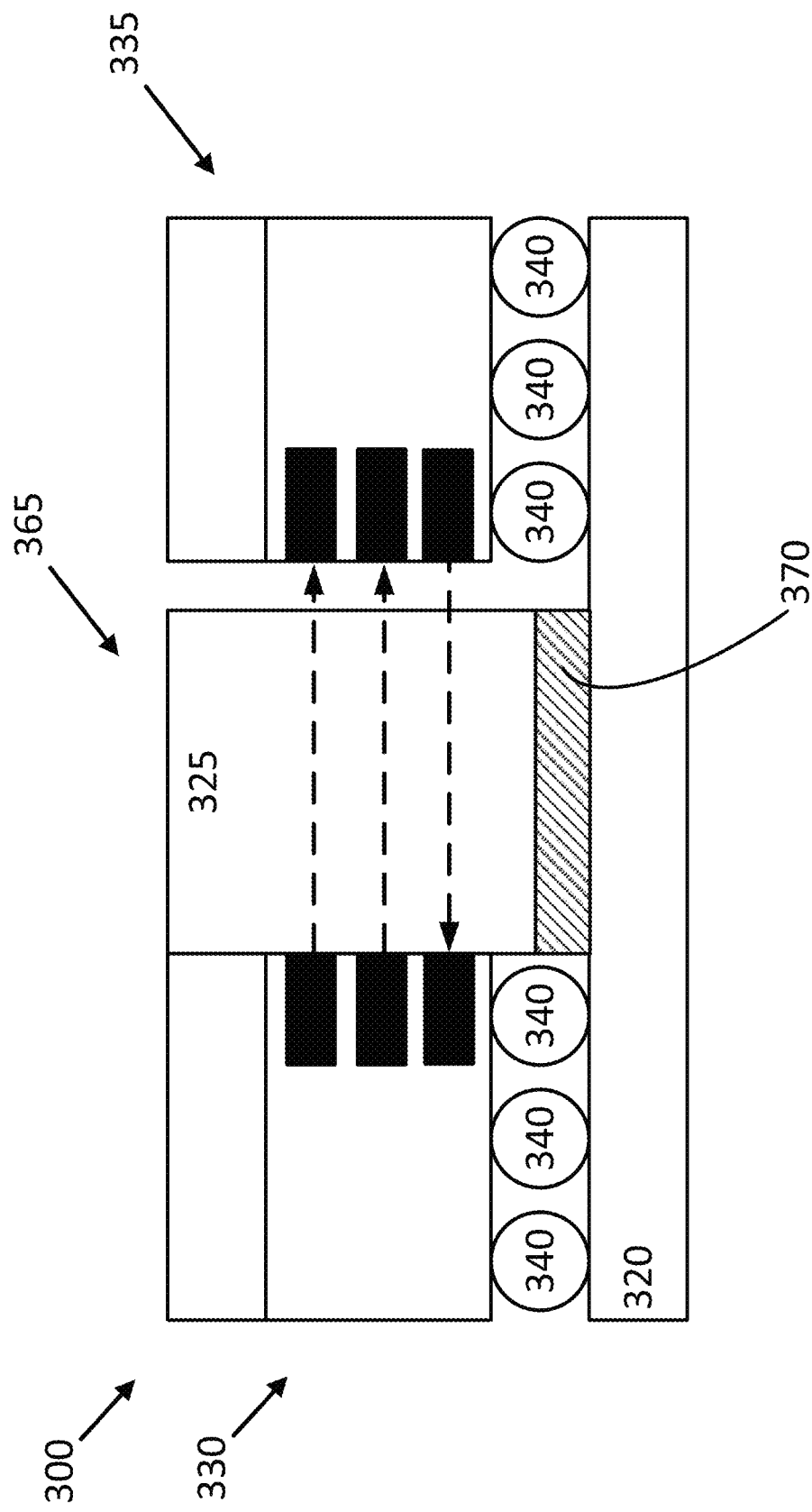
FIG. 3 depicts an alternative simplified example diagram of a multichip package with side-radiating wave launcher and a waveguide, in accordance with embodiments of the present disclosure.

FIG. 3 depicts an alternative simplified example diagram of a multichip package with side-radiating wave launcher and a waveguide, in accordance with embodiments of the present disclosure. Generally, FIG. 3 may include elements similar to those described above with respect to FIG. 1. However, for the sake of elimination of redundancy, some elements (e.g. the signal launchers, etc.) may not be specifically called out, and certain additional elements such as the PCB 105, socket 110, or interconnects 115 are not re-depicted in FIG. 3. Elements of FIG. 3 that are similar to elements of FIG. 1 may share one or more of the above-described characteristics of the elements of FIG. 1.

Generally, FIG. 3 may include a semiconductor package 300, which may be similar to semiconductor package 100. The semiconductor package 300 may include a package substrate 320, which may be similar to package substrate 120. The semiconductor package 300 may further includes dies 330 and 335, which may be similar to dies 130 and 135. The dies 330 and 335 may be coupled with the package substrate 320 by interconnects 340, which may be similar to interconnects 140. The dies 330 and 335 may form a cavity 365 between them, which may be similar to cavity 165. A waveguide 325, which may be similar to waveguide 125, may be positioned in the cavity 365.

As can be seen in FIG. 3, the waveguide 325 may be coupled with the package substrate 320 by an adhesive thin film 370. The thin film 370 may be, for example, a silicon adhesive polyimide film. More specifically, the thin film 370 may be double-side kapton-tape, a polyimide tape with an acrylic adhesive, etc. Generally, the thin film 370 may be adhesive on both sides of the thin film. The thin film 370 may be coupled with the package substrate 320, and then the waveguide 325 may be placed in the cavity 365 and adhered to the thin film. In other embodiments, the thin film 370 may first be adhered to the waveguide 325, and then the thin film 370 and waveguide 325 may be positioned in the cavity 365 and adhered to the package substrate 320.

Figure 4:
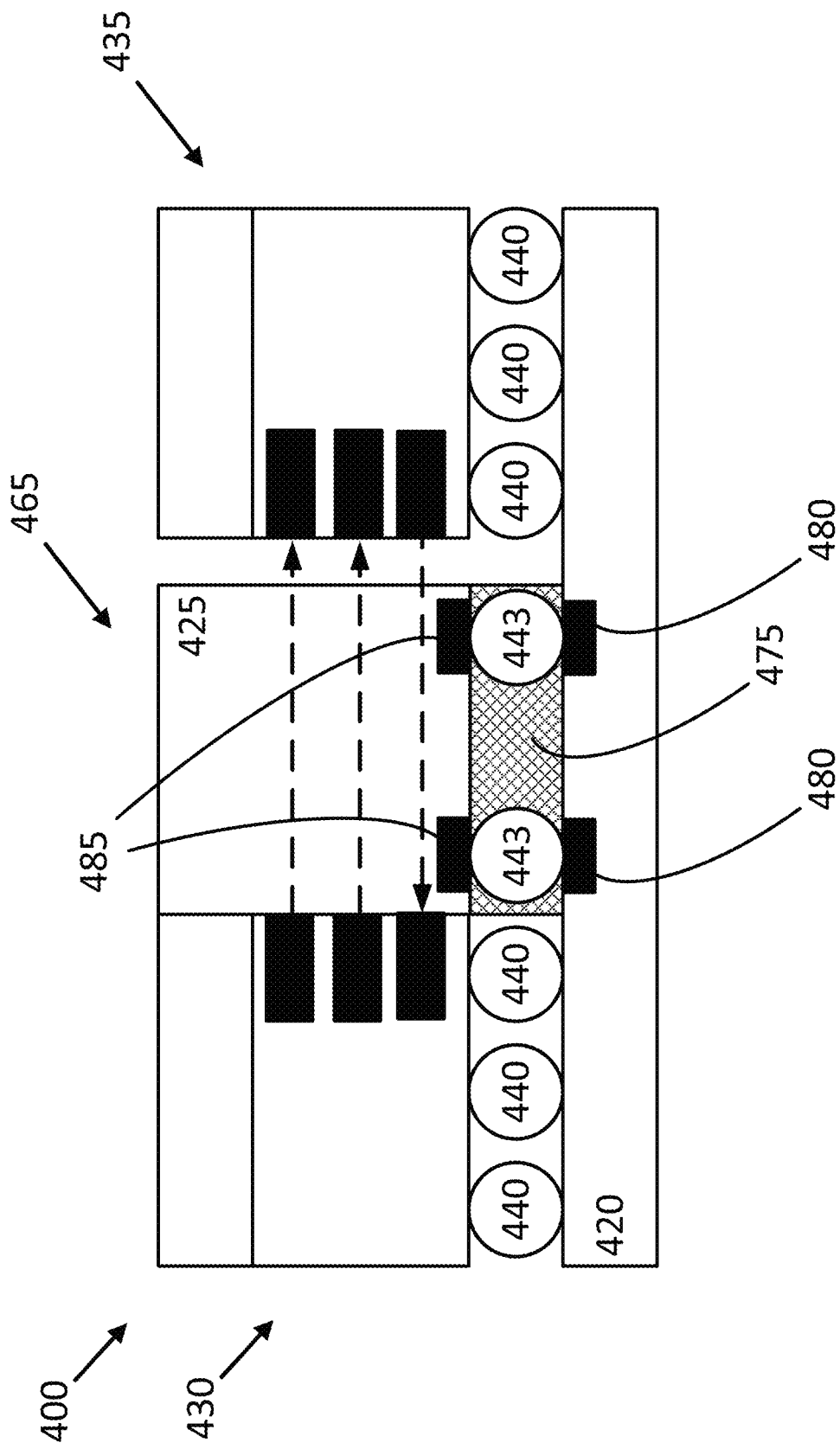
FIG. 4 depicts an alternative simplified example diagram of a multichip package with side-radiating wave launchers and a waveguide, in accordance with embodiments of the present disclosure.

FIG. 4 depicts an alternative simplified example diagram of a multichip package with side-radiating wave launcher and a waveguide, in accordance with embodiments of the present disclosure. Similarly to FIG. 3, FIG. 4 may include elements similar to those described above with respect to FIG. 1. However, for the sake of elimination of redundancy, some elements (e.g. the signal launchers, etc.) may not be specifically called out, and certain additional elements such as the PCB 105, socket 110, or interconnects 115 are not re-depicted in FIG. 4. Elements of FIG. 4 that are similar to elements of FIG. 1 may share one or more of the above-described characteristics of the elements of FIG. 1.

Generally, FIG. 4 may include a semiconductor package 400, which may be similar to semiconductor package 100. The semiconductor package 400 may include a package substrate 420, which may be similar to package substrate 120. The semiconductor package 400 may further includes dies 430 and 435, which may be similar to dies 130 and 135. The dies 430 and 435 may be coupled with the package substrate 420 by interconnects 440, which may be similar to interconnects 140. The dies 430 and 435 may form a cavity 465 between them, which may be similar to cavity 165. A waveguide 425, which may be similar to waveguide 125, may be positioned in the cavity 465.

As can be seen in FIG. 4, the waveguide 425 may be coupled with the package substrate 420 by one or more interconnects 443, which may be similar to interconnects 440. Specifically, the interconnects 443 may be solder balls or solder bumps. In this embodiment, in may be desirable for one or both of the package substrate 420 and the waveguide 425 to include pads 480/485. The pads 480/485 may be desirable to allow for a more thorough coupling of the interconnects 443 to the waveguide 425 or the substrate 420. In this embodiment, to increase structural stability, an underfill 475 may be present and generally surround the interconnects 443. In some embodiments, the underfill 475 may provide additional adherence of the waveguide 425 to the package substrate 420.

It will be understood that FIGS. 1, 3, and 4 are intended as example Figures, as noted above. Variations to one or more of the semiconductor packages 100/300/400 may be considered in other embodiments. For example, although the various dies 130/135/etc. are depicted as being coupled with the package substrate 120 via interconnects 140, in other embodiments the dies 130/135/etc. may be coupled using a different type of interconnect such as a clamp/socket/etc. In other embodiments one or more of the various dies 130/135/etc., or the waveguide 125/etc. may be in a FC configuration. Although the signal launchers 160/etc. are shown as being in a "stacked" configuration (i.e., along the "Z" axis of FIG. 1), in other embodiments one or more of the signal launchers 160/etc. may be side-by-side (e.g., arranged along a "Y" axis that is perpendicular to both the "Z" axis and the "X" axis of FIG. 1). Additionally, as noted, the relative sizes and dimensions of certain elements are not intended as definitive based on the Figures. Rather, for example, various of the dies 130/135/etc. may have a different size than depicted, the waveguide 125/etc. may have a different size, the interconnects 115/140/etc. may have a different size, etc. In some embodiments the relative lateral sizes of certain elements (e.g., the lateral size of waveguide 325 as compared to the lateral size of thin film 370) may be different than depicted such that one element may be larger than the other. In some embodiments the underfill such as underfill 475 may at least partially extend beyond the lateral area of waveguide 425 (e.g., to also underfill dies 430 or 435), or may at least partially extend up the side of waveguide 425 (e.g. to further fill portions of cavity 465). In some embodiments, although a cavity such as cavity 165 is depicted as being primarily formed by the dies 130/135, in other embodiments the cavity may at least partially extend into the package substrate such as package substrate 120. These are intended as examples of such variations, and other variations may be present in other embodiments.

Generally, crosstalk between neighboring channels within the waveguide may affect final system performance. Some embodiments may use one or more techniques to reduce crosstalk. One technique for reducing crosstalk may be to space neighboring channels of the waveguide from one another. In these embodiments, the choice of the intermediate material between the channels may affect the low-loss operation or signal confinement within the waveguide. One material that may be used may be air, however, in some embodiments air may create problems from a manufacturing or assembly operations perspective. Another possible material may be a material that is both low-loss and low-permittivity (as compared to the relatively high-permittivity material of the waveguide).

Figure 5:
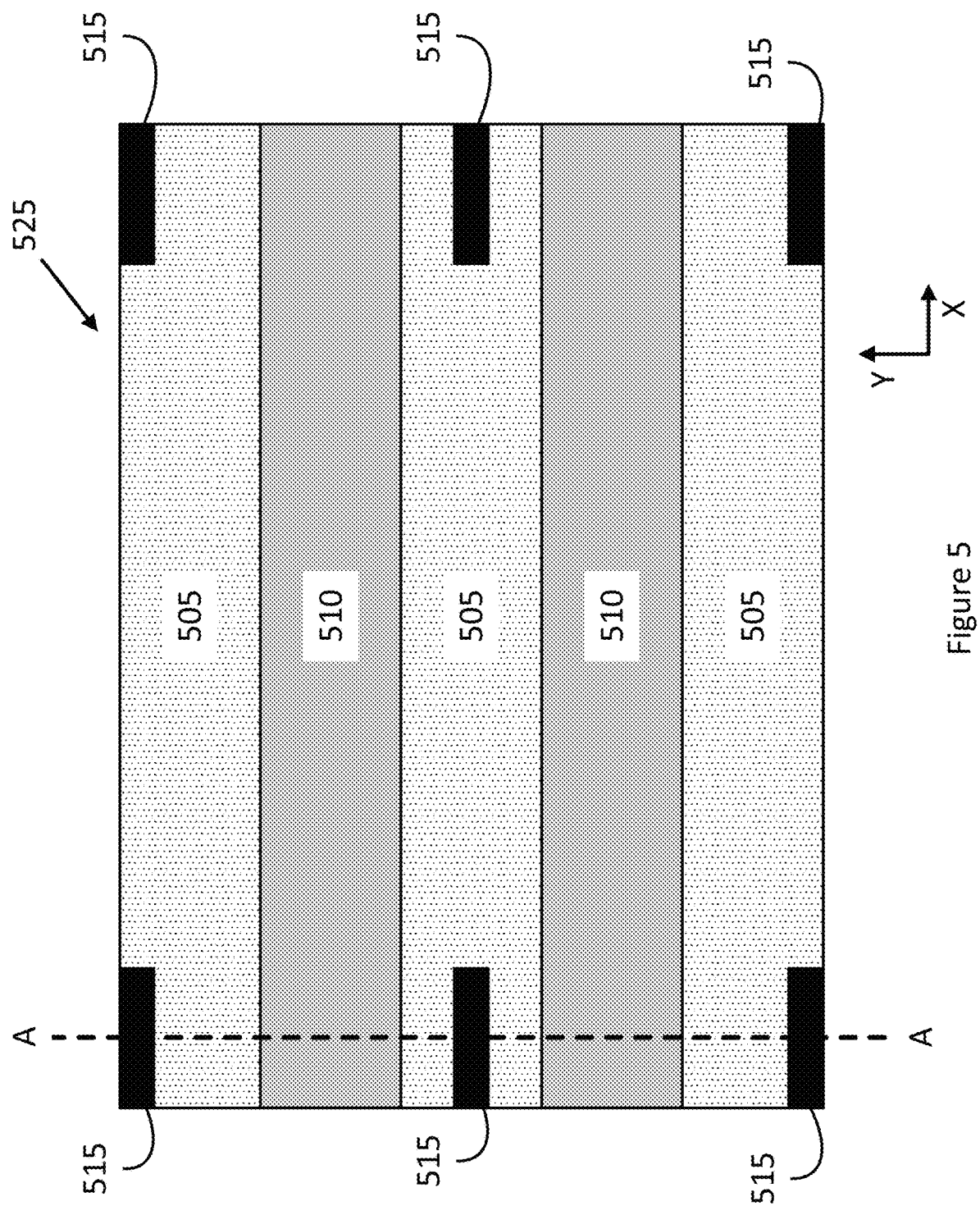
FIG. 5 depicts a simplified example top-down view of a waveguide, in accordance with embodiments of the present disclosure.

An example of this use of a low-loss/low-permittivity material between channels of a waveguide may be seen in FIG. 5. Specifically, FIG. 5 depicts a simplified example waveguide 525, in accordance with embodiments of the present disclosure. The waveguide 525 may be generally similar to one or more of waveguides 125/325/425, and share one or more of the characteristics described above with respect to those waveguides. Specifically, FIG. 5 may be viewed as depicting a waveguide 525 from the top-down (e.g., from the top of waveguide 125 to the bottom of waveguide 125 as oriented in FIG. 1). More specifically, axes "X," "Y," and "Z," of FIGS. 1 and 5 may all be viewed as perpendicular to one another. The "X" axis of FIG. 1 may be equivalent to the "X" axis of FIG. 5. The "Y" axis of FIG. 5 may be viewed as going into (or out of) the page of FIG. 1, and similarly the "Z" axis of FIG. 1 may be viewed as going into (or out of) the page of FIG. 5.

Generally, the waveguide 525 may include alternating channels 510 with a section 505 positioned therebetween. The channels 510 may be formed of a waveguide material which may be similar to the relatively high dielectric constant material described above with respect to waveguide 125. The waveguide 525 may further include a plurality of sections 505 of a relatively low dielectric constant material. Generally, it may be desirable for the relatively low dielectric constant material and the high dielectric constant material to have a difference in dielectric constants greater than or equal to approximately 0.7. Example materials with a relatively low dielectric constant may include quartz, silicon dioxide, LTCC, PEEK, PET, PTFE, PE, FEP, foamed or porous PTFE, foamed or porous PE, foamed or porous FEP, or some other similar material.

In some embodiments, the sections 505 may have a width (i.e., a distance along the "Y" axis of FIG. 5) of between approximately 100 microns and approximately 1000 microns. Similarly, the channels 510 may have a width (i.e., a distance along the "Y" axis of FIG. 5) of between approximately 100 microns and 1000 microns. However, it will be understood that the width of the sections 505 may not necessarily be the same as the width of the channels 510. For example, the width of the sections 505 may be based on a factor such as the amount of crosstalk that is allowed in the system. In other embodiments, one or both of section 505 and channel 510 may be larger or smaller.

In some embodiments, and as will be described in further detail below, one or more ground/shielding structures 515 may be present in the sections 505 at the periphery of the waveguide 525. Specifically, the ground/shielding structures 515 may provide further shielding at the waveguide—die interface, thereby reducing the discontinuity at the interface which may result in additional crosstalk generation. Generally, the ground/shielding structures may be formed of a relatively RF-impermeable or electromagnetic-impermeable material such as a conductive plastic material, a conductive metallic material, etc. In some embodiments, the ground/ shielding structures 515 may have a width (i.e., a distance as measured along the "Y" axis) of between approximately 20 microns and approximately 100 microns. Similarly, the ground/shielding structures 515 may have a length (i.e., a distance as measured along the "Z" axis) of between approximately 20 microns and approximately 500 microns. It will be understood that although the ground/shielding structures 515 are depicted as separate elements in FIG. 5, in some embodiments the ground/shielding structures 515 of a single channel may be coupled with one another. Additionally, in some embodiments the ground/shielding structures 515 may be located in a different portion of the section 505 than depicted (e.g., not in the center, or not at the periphery, etc.)

Figure 6:
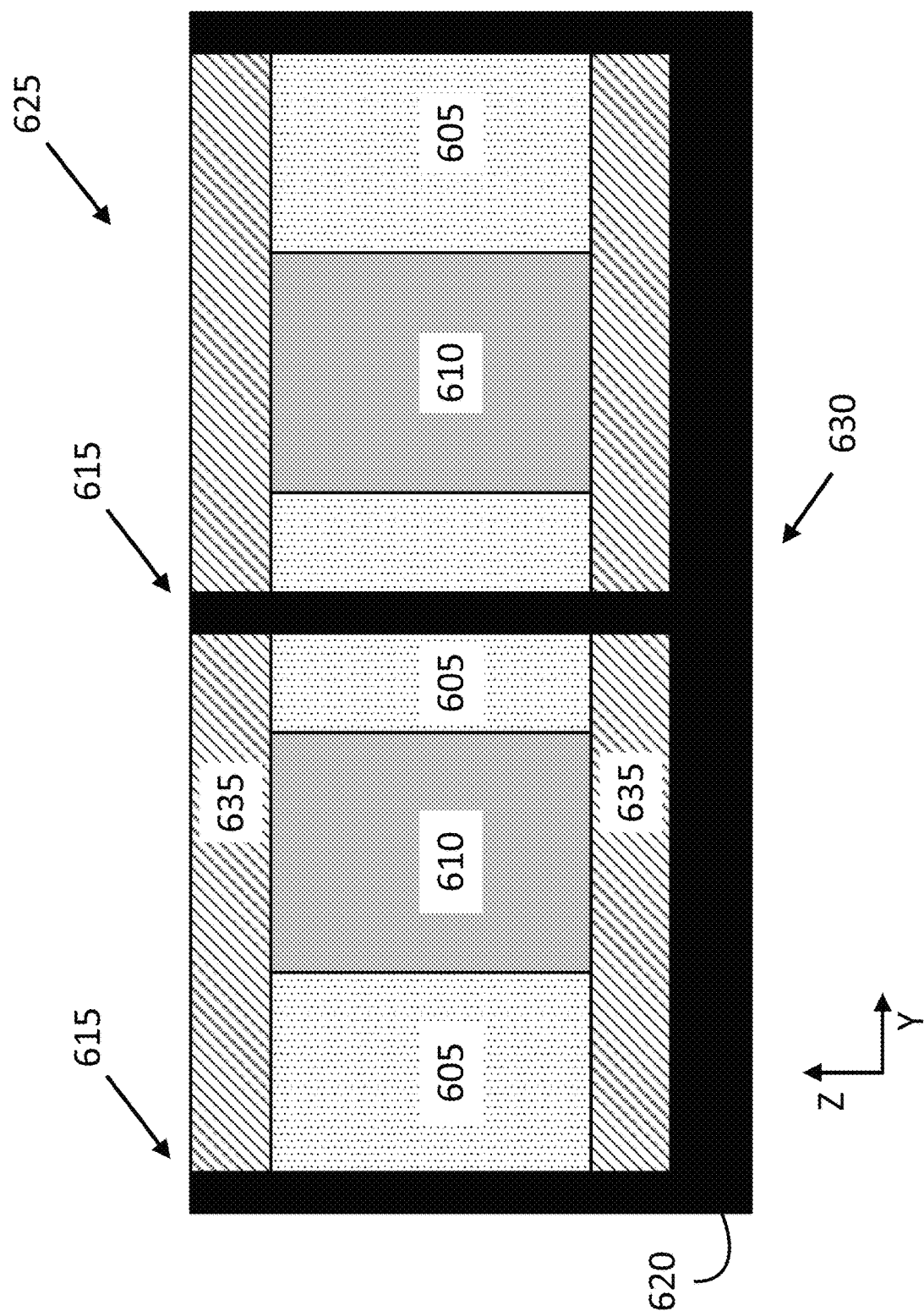
FIG. 6 depicts a simplified front-on cross-sectional view of a waveguide, in accordance with embodiments of the present disclosure.

FIG. 6 depicts an alternative simplified cross-sectional view of a waveguide 625, in accordance with embodiments of the present disclosure. The waveguide 625 may be generally similar to waveguides 125/325/425/525, and share one or more of the characteristics described above with respect to those waveguides. Specifically, the view of waveguide 625 may be considered to be taken along line A-A of waveguide 525. The "Z" axis of FIG. 6 may generally correspond to the "Z" axis of FIG. 1, and the "Y" axis of FIG. 6 may generally correspond to the "Y" axis of FIG. 5.

Generally, the waveguide 625 may includes sections 605 and channels 610, which may be similar to sections 505 and channels 510 of FIG. 5. The waveguide 625 may further includes layers 635 of a material with a relatively low dielectric constant. For example, the layers 635 may be formed of the same material as the sections 605, or the layers 635 may be formed of a different material with a relatively low dielectric constant. The layers 635 may further help in reducing crosstalk within the waveguide 625.

The waveguide 625 may further include a ground/shielding structure 620. The ground/shielding structure 620 may be formed of a material similar to the material described above with respect to ground/shielding structures 515. The ground/shielding structure 620 may generally include one or more protrusion portions 615, which may extend through the various channels and the layers 635 if those layers 635 are present. It will be noted that protrusions 615 may generally correspond to the ground/shielding structures 515 of FIG. 5. That is, the ground/shielding structures 515 may be considered to be the visible portion of the protrusions 615 when viewed from the top of the waveguide 625 (assuming that a layer such as layer 635 is not present in the view of the waveguide 525 in FIG. 5). The ground/shielding structure 620 may further include a base plate portion 630 coupled with one of the layers 635 as depicted in FIG. 6. The base plate portion 630 may, in some embodiments, also act as an SMT pad. Specifically, the base plate portion 630 may be an element which may be coupled with a package substrate such as package substrate 120 and may serve to adhere the waveguide 625 to the package substrate. In other embodiments, the base plate portion 630 may not be an SMT pad but may instead be an element of the waveguide cladding as discussed above.

Figure 7:
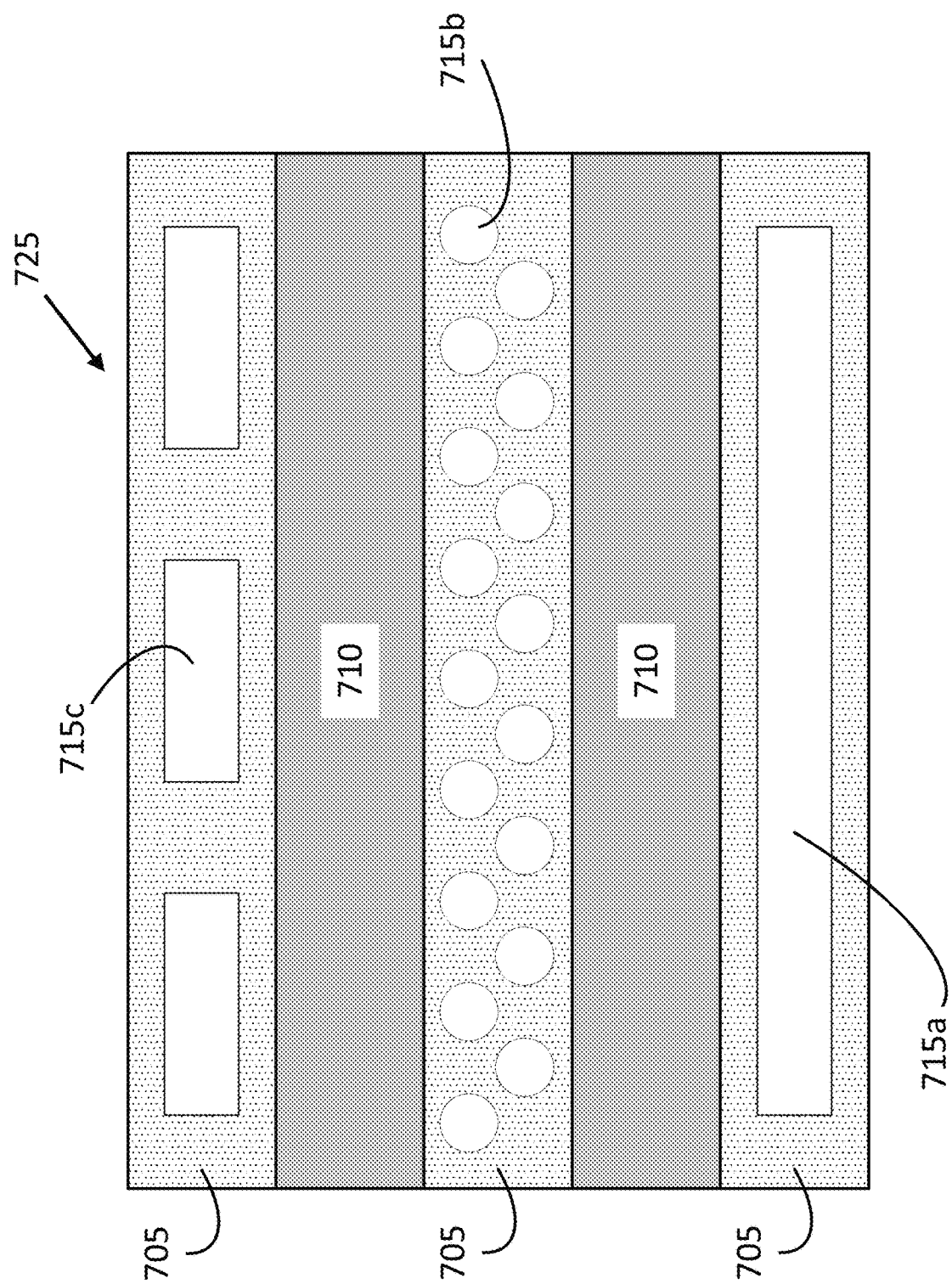
FIG. 7 depicts an alternative simplified example top-down view of a waveguide, in accordance with embodiments of the present disclosure.

As previously noted, in some embodiments air may be a desirable element to use for the relatively low dielectric material. In some embodiments the use of only air may generate problems with respect to manufacturability, however FIG. 7 depicts an alternative simplified example top-down view of a waveguide, in accordance with embodiments of the present disclosure, wherein air may be used. Specifically, FIG. 7 depicts a waveguide 725 which may be similar to waveguide 525. Waveguide 725 may include sections 705 and channels 710, which may be respectively similar to sections 505 and channels 510, and share similar characteristics to those elements.

However, as depicted in FIG. 7, the section 705 may include one or more pockets 715a/715b/715c that may further reduce the dielectric constant of the sections 705. The pockets 715a/715b/715c may be filled with the surrounding ambient gas (e.g., "air"), an inert gas that is specifically injected into the pockets, vacuum, or some other gas. In other embodiments, one or more of the pockets 715a/715b/715c may not be filled with a gas, but may instead be filled with a different material (liquid, solid, etc.) that has a relatively low dielectric constant as compared to the material of channel 710. In some embodiments, one or more of the depicted pockets 715a/715b/715c may traverse the entire height of the sections 705 (e.g., the distance along the "Z" axis depicted in FIG. 1 or 6), while in other embodiments one or more of the pockets may only traverse a portion of the sections 705. The different pockets 715a/715b/715c depict different example arrangements of pockets which may be used in various of the sections 705. However, it will be understood that other embodiments may include one or more pockets of different shapes (triangular, hexagonal, wavy, oval etc.), some sections 705 may not include pockets while other channels do, etc.

It will be understood that FIGS. 5-7 are intended as example configurations and other embodiments may include different configurations. For example, elements of the waveguide 525 may be combined with elements of the waveguide 725 and, for example, waveguide 725 may include one or more ground/shielding structures such as ground/shielding structures 515. Additionally, one or more of the sections 505/etc. or channels 510/etc. may not be the same size as another of the various channels. Similarly, although the waveguides 525/625/725 are depicted as having the waveguides alternating along the "Y" axis, in other embodiments the waveguides 525/625/725 may additionally or alternatively alternate along the "Z" axis of the various Figures. Other variations may be present in other embodiments.

Generally, the various waveguides 125/225/etc. discussed herein may have various dimensions dependent on a number of factors. The various factors may include, for example, the dielectric material used for the channels such as channels 510/610/etc., and the frequency of the signal that is propagating through the waveguide. As an example, if the waveguide material of the channel 510 has a dielectric constant of approximately 6, and the electromagnetic signal has a frequency of approximately 120 GHz, then the waveguide may have a dimension along the "Y" axis of approximately 800 microns, and a dimension along the "Z" axis of approximately 400 microns.

Alternatively, if the waveguide material of the channel 510 has a dielectric constant of approximately 6 and the electromagnetic signal has a frequency of approximately 240 GHz, then the waveguide may have a dimension along the "Y" axis of approximately 400 microns, and a dimension along the "Z" axis of approximately 200 microns.

Alternatively, if the waveguide material of the channel 510 has a dielectric constant of 10 and the electromagnetic signal has a frequency of approximately 300 GHz, then the waveguide may have a dimension along the "Y" axis of approximately 200 microns, and a dimension along the "Z" axis of approximately 100 microns.

Alternatively, if the waveguide material of the channel 510 has a dielectric constant of 10 and the electromagnetic signal has a frequency of approximately 600 GHz, then the waveguide may have a dimension along the "Y" axis of approximately 100 microns, and a dimension along the "Z" axis of approximately 50 microns.

It will be understood that the above example measurements are only intended as examples of various embodiments based on the use of a generally rectangular waveguide as depicted in the various Figures. In other embodiments, the cross-section of the entire waveguide, or one or more channels thereof, may be different than depicted. For example, the cross-section of the waveguide or a channel thereof may not be rectangular but rather may be a different shape such as circular, oval, H-shaped, etc. Additionally, the entire waveguide, or a channel thereof, may not be a single filled element but rather in some embodiments may be hollow, a mono-material structure, a multi-material structure, or some other type of structure.

Figure 8:
FIG. 8 depicts a simplified example technique for generating a multichip package with side-radiating wave launchers and a waveguide, in accordance with embodiments of the present disclosure.

FIG. 8 depicts a simplified example technique for generating a multichip package with side-radiating wave launchers and a waveguide, in accordance with embodiments of the present disclosure. Generally, the technique will be described with respect to elements of FIG. 1, but it will be understood that the technique could be applicable, in whole or in part, with or without modification, to elements of others of the Figures herein. Additionally, it will be understood that FIG. 8 is a highly simplified example, and other embodiments may include additional details.

Generally, the technique may include coupling, at 805, a die with a face of a package substrate. More specifically, the die may have an electromagnetic signal launcher that is to generate and transmit an electromagnetic signal in a direction parallel to the face of the package substrate. The die may be, for example, die 130 or die 135. The package substrate may be, for example, package substrate 120. The signal launcher may be, for example, signal launcher 160.

The technique may further include positioning, at 810, a waveguide on the face of the package substrate. More specifically, the waveguide may be adjacent to the die. The waveguide may be configured to receive the electromagnetic signal from the die and facilitate propagation of the electromagnetic signal in the direction parallel to the face of the package substrate. The waveguide may be, for example, waveguide 125.

Figure 9:
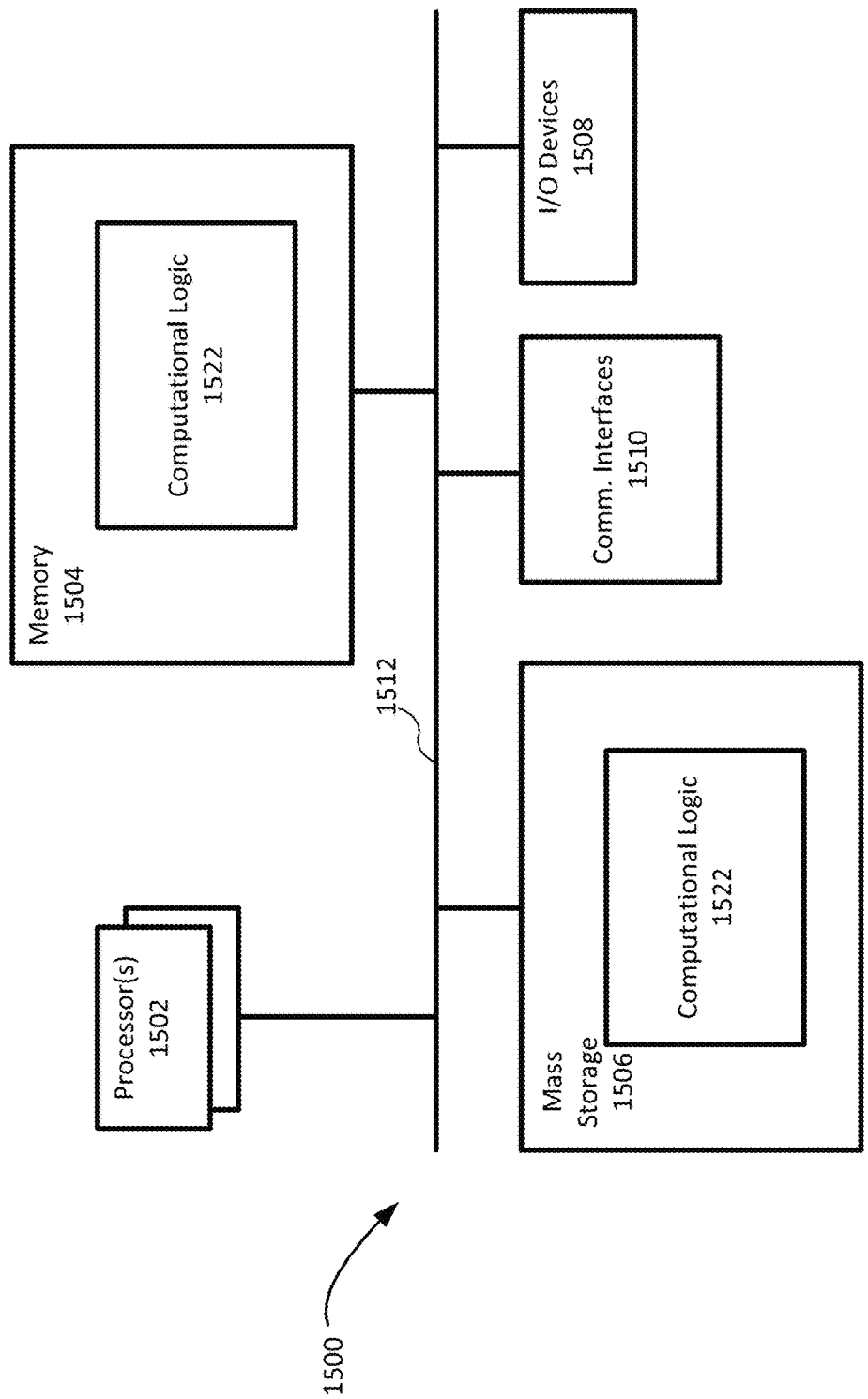
FIG. 9 illustrates an example device that may use various embodiments of the present disclosure, in accordance with various embodiments.

FIG. 9 illustrates an example electronic device 1500 suitable for use with semiconductor packages 100, 300, or 400, in accordance with various embodiments. Specifically, in some embodiments, the electronic device 1500 may include one or more of packages 100, 300, or 400 therein.

As shown, electronic device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The electronic device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid-state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The electronic device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers, transmitters, and transceivers (e.g., 5G, WiFi, Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The electronic device 1500 may further include or be coupled with a power supply. The power supply may, for example, be a power supply that is internal to the electronic device 1500 such as a battery. In other embodiments the power supply may be external to the electronic device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more down-converters, one or more upconverters, transistors, resistors, capacitors, etc. that may be used, for example, to tune or alter the current or voltage of the power supply from one level to another level. In some embodiments the power supply may be configured to provide power to the electronic device 1500 or one or more discrete components of the electronic device 1500 such as the processor(s) 1502, mass storage 1506, I/O devices 1508, etc.

The above-described electronic device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various electronic devices.

The number, capability, and/or capacity of the elements 1508, 1510, 1512 may vary, depending on whether electronic device 1500 is used as a stationary electronic device, such as a set-top box or desktop computer, or a mobile electronic device, such as a tablet electronic device, laptop computer, game console, or smartphone. Their constitutions are otherwise known, and accordingly will not be further described.

In various implementations, the electronic device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the electronic device 1500 may be any other electronic device that processes data.

As noted, the electronic device 1500 may include one or more of packages 100, 300, or 400. For example, in some embodiments the dies 130 or 135 may be one of the above-described elements such as a processor 1502, memory 1504, or some other element. The elements may be coupled together by a waveguide such as waveguide 125.

EXAMPLES OF VARIOUS EMBODIMENTS

Example 1 includes an semiconductor package with an electromagnetic interconnect, wherein the semiconductor package comprises: a package substrate with a face; a die coupled with the face of the package substrate, wherein the die includes a radiofrequency (RF) launcher that is to generate an electromagnetic signal that is to be emitted from the RF launcher in a direction parallel to the face of the package substrate; and a waveguide coupled with the face of the package substrate adjacent to the die, wherein the waveguide is to receive the electromagnetic signal from the die and transmit the electromagnetic signal in the direction parallel to the face of the package substrate.

Example 2 includes the semiconductor package of example 1, wherein the electromagnetic signal is a mmWave signal.

Example 3 includes the semiconductor package of example 1, wherein the die is a first die, and further comprising a second die coupled with the face of the package substrate, wherein the waveguide is to transmit the electromagnetic signal to the second die.

Example 4 includes the semiconductor package of example 3, wherein the distance between the first die and the second die is between 0.5 centimeters (cm) and 2 cm.

Example 5 includes the semiconductor package of example 1, wherein the die includes on-die logic that is to generate a data signal, and wherein the RF launcher is to generate the electromagnetic signal based on the data signal.

Example 6 includes the semiconductor package of any of examples 1-5, wherein the waveguide is coupled with the face of the package substrate by a surface-mount technology (SMT) technique.

Example 7 includes the semiconductor package of example 6, wherein the SMT technique includes an adhesive material, a mold material, an epoxy material, a retention mechanism, or a film material.

Example 8 includes the semiconductor package of any of examples 1-5, wherein the die is physically coupled with the waveguide.

Example 9 includes the semiconductor package of any of examples 1-5, wherein the die is physically separated from the waveguide.

Example 10 includes the semiconductor package of example 9, further comprising an underfill material positioned between the waveguide and the die.

Example 11 includes the semiconductor package of any of examples 1-5, wherein the RF launcher is a Vivaldi antenna, broadband microstrip-to-tapered slot transition, or horn-like launcher structure.

Example 12 includes an electronic device with an semiconductor package that has a waveguide, wherein the electronic device comprises: a motherboard; and an semiconductor package coupled with the motherboard, wherein the semiconductor package includes: a package substrate with a face; a first die coupled with the face of the package substrate, wherein the first die includes an electromagnetic launcher that is to generate and transmit an electromagnetic signal in a direction parallel to the face of the package substrate; a second die coupled with the face of the package substrate; and a waveguide positioned between the first die and the second die, wherein the waveguide includes a first waveguide material with a first dielectric constant, and the waveguide is receive the electromagnetic signal from the first die and provide the electromagnetic signal to the second die.

Example 13 includes the electronic device of example 12, wherein the first waveguide material is silicon (Si), glass, quartz, polyetheretherketone (PEEK), or polyethylene terephthalate (PET).

Example 14 includes the electronic device of examples 12 or 13, wherein the waveguide includes a plurality of channels of the first waveguide material, and a guard channel positioned between two of the plurality of channels, wherein the guard channel includes a second waveguide material with a second dielectric constant that is lower than the first dielectric constant.

Example 15 includes the electronic device of example 14, wherein the guard channel includes an airgap.

Example 16 includes the electronic device of example 14, wherein the guard channel includes a conductive shield element at a portion of the waveguide that is adjacent to the first die or the second die.

Example 17 includes the electronic device of example 14, wherein the first dielectric constant is 6, the electromagnetic signal has a frequency of 120 gigahertz (GHz), and the waveguide has dimensions of 800 micrometers in a first direction measured parallel to the face of the substrate and perpendicular to a direction of propagation of the electromagnetic signal, and 400 micrometers in a second direction measured perpendicular to the face of the substrate.

Example 18 includes the electronic device of example 14, wherein the first dielectric constant is 6, the electromagnetic signal has a frequency of 240 gigahertz (GHz), and the waveguide has dimensions of 400 micrometers in a first direction measured parallel to the face of the substrate and perpendicular to a direction of propagation of the electromagnetic signal, and 200 micrometers in a second direction measured perpendicular to the face of the substrate.

Example 19 includes the electronic device of example 14, wherein the first dielectric constant is 10, the electromagnetic signal has a frequency of 300 gigahertz (GHz), and the waveguide has dimensions of 100 micrometers in a first direction measured parallel to the face of the substrate and perpendicular to a direction of propagation of the electromagnetic signal, and 200 micrometers in a second direction measured perpendicular to the face of the substrate.

Example 20 includes the electronic device of example 14, wherein the first dielectric constant is 10, the electromagnetic signal has a frequency of 600 gigahertz (GHz), and the waveguide has dimensions of 100 micrometers in a first direction measured parallel to the face of the substrate and perpendicular to a direction of propagation of the electromagnetic signal, and 50 micrometers in a second direction measured perpendicular to the face of the substrate.

Example 21 includes a method of forming an semiconductor package with a waveguide, wherein the method comprises: coupling a die with a face of a package substrate, wherein the die has an electromagnetic signal launcher that is to generate and transmit an electromagnetic signal in a direction parallel to the face of the package substrate; and positioning a waveguide on the face of the package substrate, wherein the waveguide is adjacent to the die and is to receive the electromagnetic signal from the die and facilitate propagation of the electromagnetic signal in the direction parallel to the face of the package substrate.

Example 22 includes the method of example 21, wherein the die is a first die and further comprising coupling a second die with the face of the package substrate, wherein the waveguide is to facilitate propagation of the electromagnetic signal to the second die.

Example 23 includes the method of example 21, wherein the electromagnetic signal has a frequency greater than 300 gigahertz (GHz)

Example 24 includes the method of example 21, wherein positioning the waveguide on the face of the package substrate includes coupling the waveguide with the face of the package substrate by a surface-mount technology (SMT) technique.

Example 25 includes the method of example 24, wherein the SMT technique includes an adhesive material, a mold material, an epoxy material, a retention mechanism, or a film material.

Example 26 includes the method of example 21, wherein positioning the waveguide on the face of the package substrate includes manufacturing the waveguide on the package substrate.

Example 27 includes the method of example 21, wherein the waveguide includes silicon (Si), glass, quartz, polyetheretherketone (PEEK), or polyethylene terephthalate (PET).

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A semiconductor package, comprising:
a package substrate with a face;
a die coupled with the face of the package substrate, wherein the die includes a radiofrequency (RF) launcher that is to generate an electromagnetic signal that is to be emitted from the RF launcher in a direction parallel to the face of the package substrate; and
a waveguide that is adjacent to the die, wherein the waveguide is coupled with the face of the package substrate, and wherein the waveguide is to receive the electromagnetic signal from the die and facilitate propagation of the electromagnetic signal in the direction parallel to the face of the package substrate.

2. The semiconductor package of claim 1, wherein the electromagnetic signal is a millimeter wave (mmWave) signal.

3. The semiconductor package of claim 1, wherein the die is a first die, and further comprising a second die coupled with the face of the package substrate, wherein the waveguide is to transmit the electromagnetic signal to the second die.

4. The semiconductor package of claim 1, wherein the die includes on-die logic that is to generate a data signal, and wherein the RF launcher is to generate the electromagnetic signal based on the data signal.

5. The semiconductor package of claim 1, wherein the waveguide is coupled with the face of the package substrate by a surface-mount technology (SMT) technique.

6. The semiconductor package of claim 1, wherein the die is physically coupled with the waveguide.

7. The semiconductor package of claim 1, wherein the die is physically separated from the waveguide.

8. The semiconductor package of claim 1, wherein the RF launcher is a Vivaldi antenna, broadband microstrip-to-tapered slot transition, or horn-like launcher structure.

9. An electronic device with a semiconductor package that includes a waveguide, wherein the electronic device comprises:
a motherboard; and
a semiconductor package coupled with the motherboard, wherein the semiconductor package includes:
a package substrate with a face;
a first die coupled with the face of the package substrate, wherein the first die includes an electromagnetic launcher that is to generate and transmit an electromagnetic signal in a direction parallel to the face of the package substrate;
a second die coupled with the face of the package substrate; and
the waveguide positioned between the first die and the second die, wherein the waveguide includes a first waveguide material with a first dielectric constant, and the waveguide is to receive the electromagnetic signal from the first die and provide the electromagnetic signal to the second die.

10. The electronic device of claim 9, wherein the first waveguide material is silicon (Si), glass, quartz, polyetheretherketone (PEEK), or polyethylene terephthalate (PET).

11. The electronic device of claim 9, wherein the waveguide includes a plurality of channels of the first waveguide material, and a guard channel positioned between two of the plurality of channels, wherein the guard channel includes a second waveguide material with a second dielectric constant that is lower than the first dielectric constant.

12. The electronic device of claim 11, wherein the guard channel includes an airgap.

13. The electronic device of claim 11, wherein the guard channel includes a conductive shield element at a portion of the waveguide that is adjacent to the first die or the second die.

14. The electronic device of claim 11, wherein the first dielectric constant is 6, the electromagnetic signal has a frequency of 120 gigahertz (GHz), and the waveguide has dimensions of 800 micrometers in a first direction measured parallel to the face of the substrate and perpendicular to a direction of propagation of the electromagnetic signal, and 400 micrometers in a second direction measured perpendicular to the face of the substrate.

15. A method of forming a semiconductor package with a waveguide, wherein the method comprises:
coupling a die with a face of a package substrate, wherein the die has an electromagnetic signal launcher that is to generate and transmit an electromagnetic signal in a direction parallel to the face of the package substrate; and
positioning a waveguide on the face of the package substrate, wherein the waveguide is adjacent to the die and is to receive the electromagnetic signal from the die and facilitate propagation of the electromagnetic signal in the direction parallel to the face of the package substrate.

16. The method of claim 15, wherein the die is a first die and further comprising coupling a second die with the face of the package substrate, wherein the waveguide is to facilitate propagation of the electromagnetic signal to the second die.

17. The method of claim 15, wherein the electromagnetic signal has a frequency greater than 300 gigahertz (GHz).

18. The method of claim 15, wherein positioning the waveguide on the face of the package substrate includes coupling the waveguide with the face of the package substrate by a surface-mount technology (SMT) technique.

19. The method of claim 15, wherein positioning the waveguide on the face of the package substrate includes manufacturing the waveguide on the package substrate.

20. The method of claim 15, wherein the waveguide includes silicon (Si), glass, quartz, polyetheretherketone (PEEK), or polyethylene terephthalate (PET).

* * * * *